United States Patent
Jalowiecki et al.

(10) Patent No.: US 7,096,318 B2
(45) Date of Patent: Aug. 22, 2006

(54) CONTENT-ADDRESSABLE (ASSOCIATIVE) MEMORY DEVICES

(75) Inventors: Ian Paul Jalowiecki, High Wycombe (GB); John Lancaster, High Wycombe (GB); Anargyros Krikelis, High Wycombe (GB)

(73) Assignee: Aspex Technology Limited, (GB)

(*) Notice: Subject to any disclaimer, the term of this patent is extended or adjusted under 35 U.S.C. 154(b) by 93 days.

(21) Appl. No.: 10/432,307

(22) PCT Filed: Nov. 21, 2001

(86) PCT No.: PCT/GB01/05134
§ 371 (c)(1),
(2), (4) Date: Apr. 16, 2004

(87) PCT Pub. No.: WO02/43068
PCT Pub. Date: May 30, 2002

(65) Prior Publication Data
US 2004/0199724 A1    Oct. 7, 2004

(30) Foreign Application Priority Data
Nov. 21, 2000 (GB) .................................. 0028356.4
Nov. 21, 2000 (GB) .................................. 0028357.2

(51) Int. Cl.
*G06F 13/28* (2006.01)

(52) U.S. Cl. ........................ 711/128; 711/49; 711/106; 711/108

(58) Field of Classification Search ................ 365/49, 365/230.03, 239; 341/75; 706/50; 707/7; 710/3; 711/123; 712/14, 226
See application file for complete search history.

(56) References Cited

U.S. PATENT DOCUMENTS 3,851,313 A * 11/1974 Chang ........................ 365/239

(Continued)

FOREIGN PATENT DOCUMENTS

JP         62005510        1/1987

(Continued)

*Primary Examiner*—Pierre Bataille
*Assistant Examiner*—Chase Peers
(74) *Attorney, Agent, or Firm*—Dinsmore & Shohl LLP

(57) ABSTRACT

A compound associative memory for use with a data-parallel computer, and a method of storing/retrieving data in the compound associative memory is disclosed. The memory comprises a bit-parallel word-organized associative memory having an array of associative memory cells arranged to be capable of bit-parallel search and write operations. A bit-serial associative memory having an array of memory cells arranged to be capable of bit-serial search and write operations, but not word bit-parallel search and write operations, is also included. The bit-serial memory is operatively connected to the bit-parallel memory and arranged to operate as an extension of the same. The method comprises searching the bit-parallel word-organized associative memory and/or the bit-serial associative memory coupled to the bit-parallel memory for data matching search data, and marking the memory cells having stored data matching the search data.

28 Claims, 8 Drawing Sheets

U.S. PATENT DOCUMENTS

| | | | |
|---|---|---|---|
| 4,038,538 A * | 7/1977 | Semmelhaack et al. | 341/75 |
| 4,159,538 A * | 6/1979 | Motsch | 365/49 |
| 4,755,974 A * | 7/1988 | Yamada et al. | 365/49 |
| 4,760,523 A * | 7/1988 | Yu et al. | 707/7 |
| 4,799,192 A * | 1/1989 | Wade et al. | 365/49 |
| 4,933,835 A * | 6/1990 | Sachs et al. | 711/123 |
| 4,964,040 A * | 10/1990 | Wilcox | 710/3 |
| 5,051,949 A * | 9/1991 | Young | 365/49 |
| 5,072,422 A * | 12/1991 | Rachels | 365/49 |
| 5,276,650 A | 1/1994 | Kubota | |
| 5,483,479 A | 1/1996 | Osawa et al. | |
| 5,579,441 A * | 11/1996 | Bezek et al. | 706/50 |
| 5,978,246 A * | 11/1999 | Shindo | 365/49 |
| 6,044,005 A | 3/2000 | Gibson et al. | |
| 6,072,745 A * | 6/2000 | Ng et al. | 365/230.03 |
| 6,078,513 A | 6/2000 | Ong et al. | |
| 6,137,707 A | 10/2000 | Srinivasan et al. | |
| 6,212,628 B1 * | 4/2001 | Abercrombie et al. | 712/226 |
| 6,275,920 B1 * | 8/2001 | Abercrombie et al. | 712/14 |

FOREIGN PATENT DOCUMENTS

| | | |
|---|---|---|
| JP | 10198324 | 7/1998 |

* cited by examiner

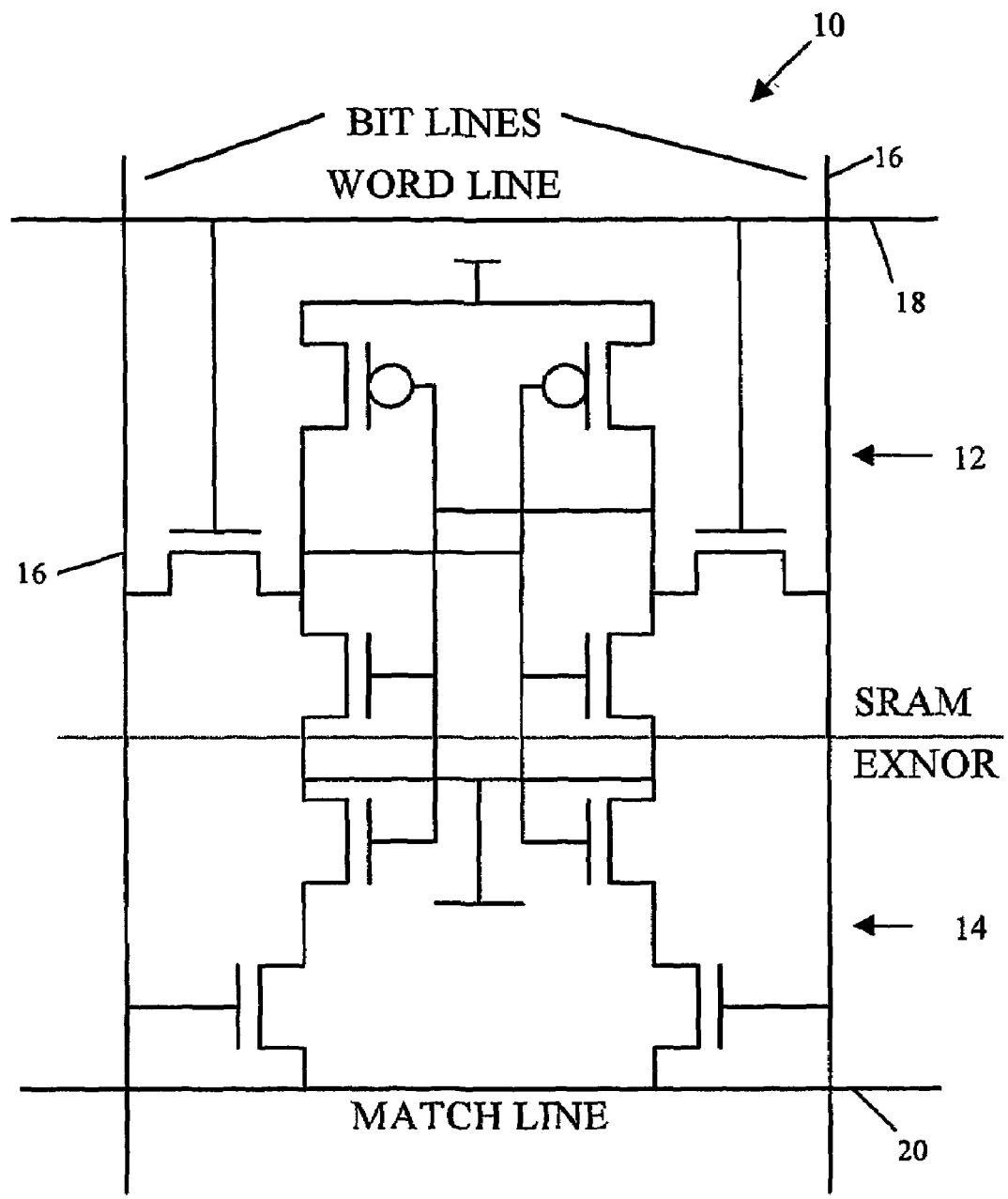
Figure 1 Prior-art SRAM-based CAM cell

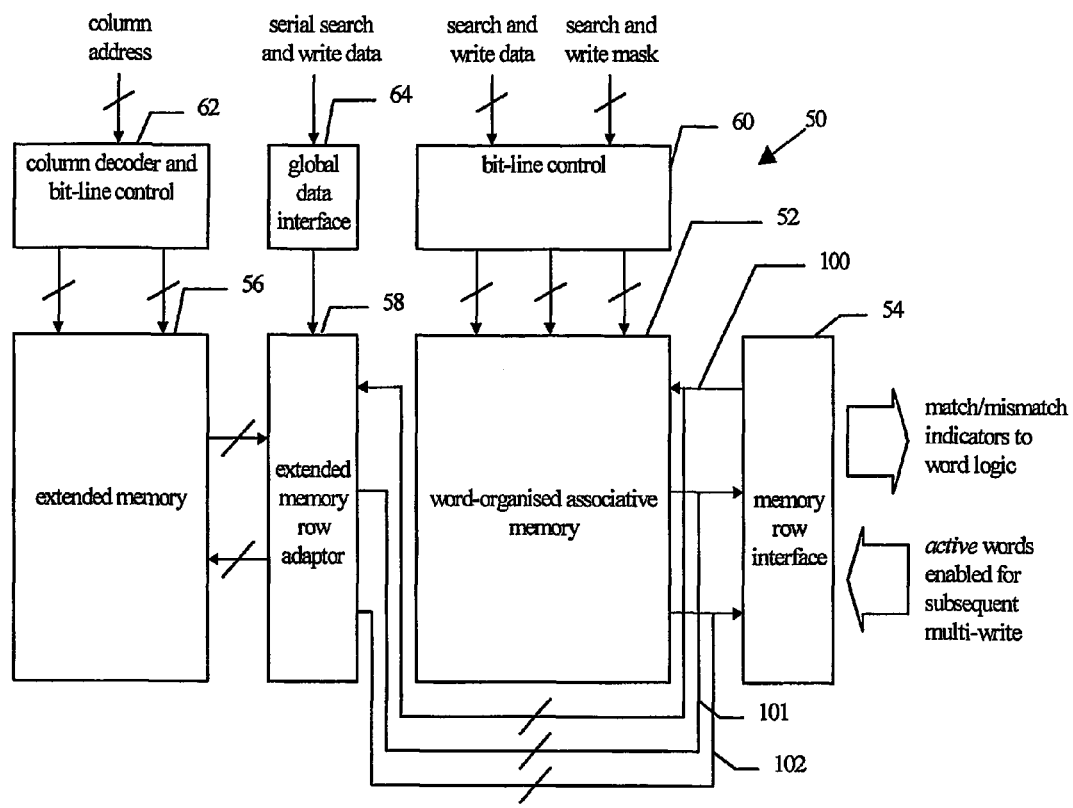
Figure 2 Associative Memory organisation showing main and extended memory banks

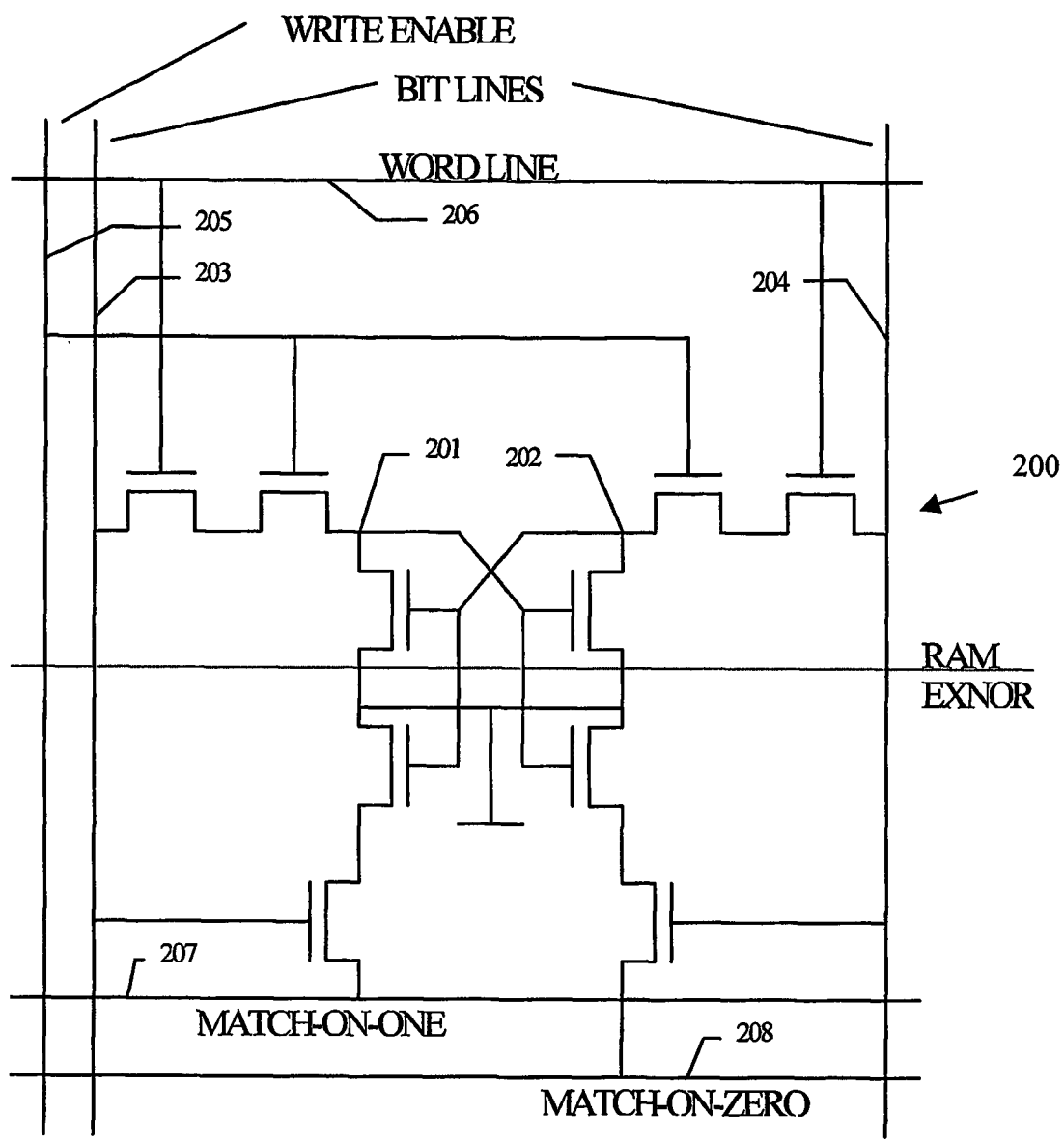
Figure 3 ASP word-organised 10-transistor CAM cell

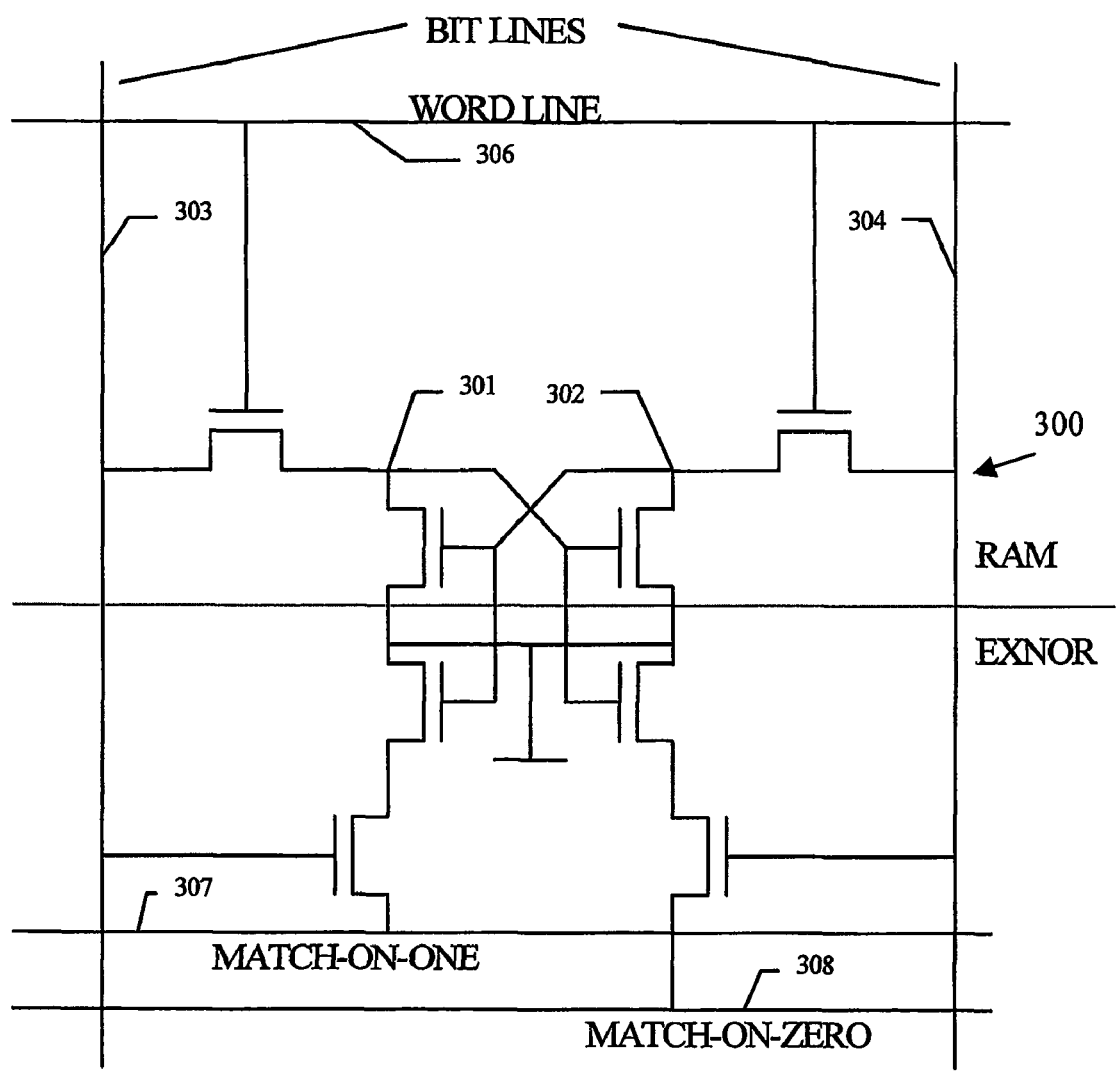
Figure 4 Alternative non-explicit mask CAM cell

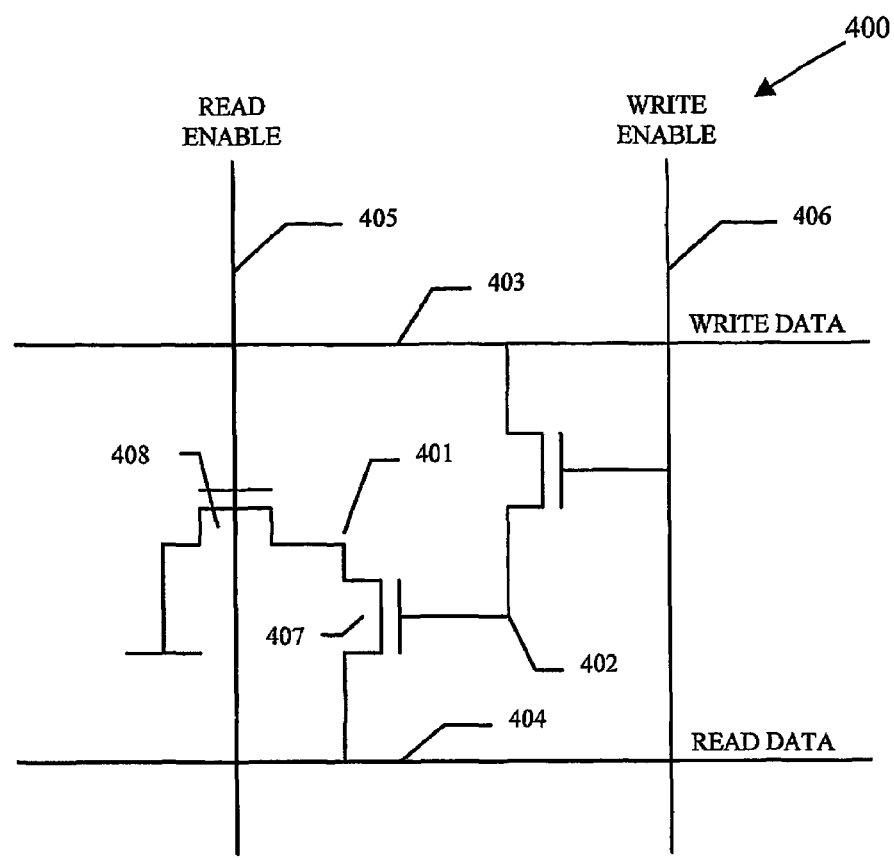
Figure 5 3-transistor extended memory cell
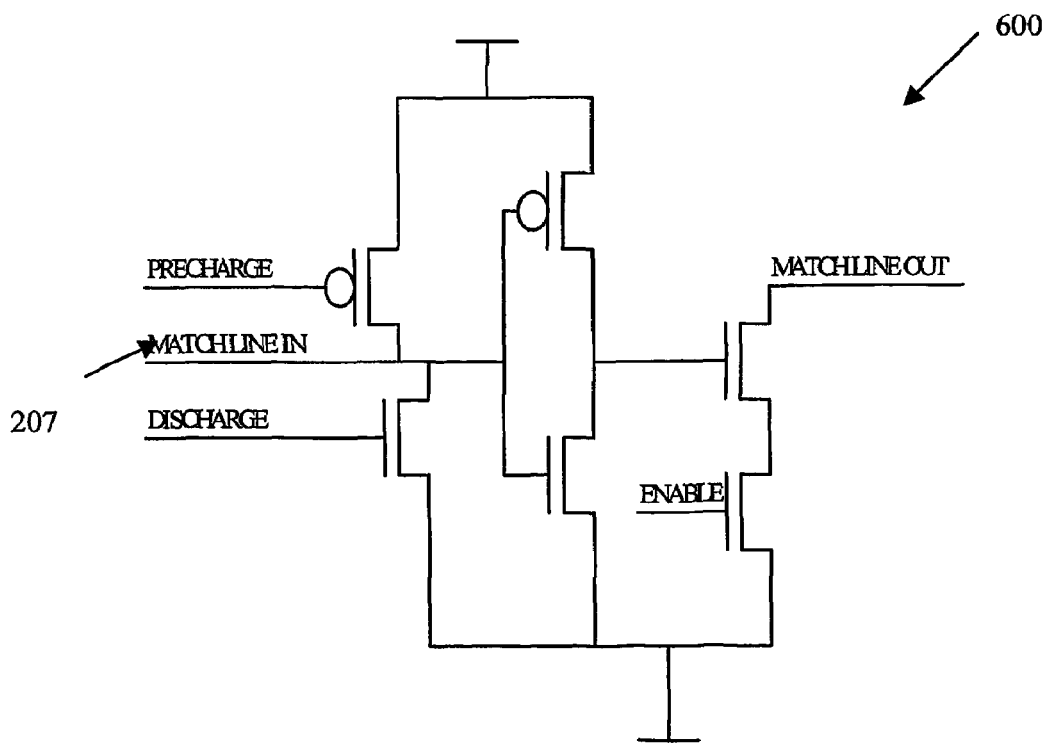
Figure 7 Match-line sense amplifier

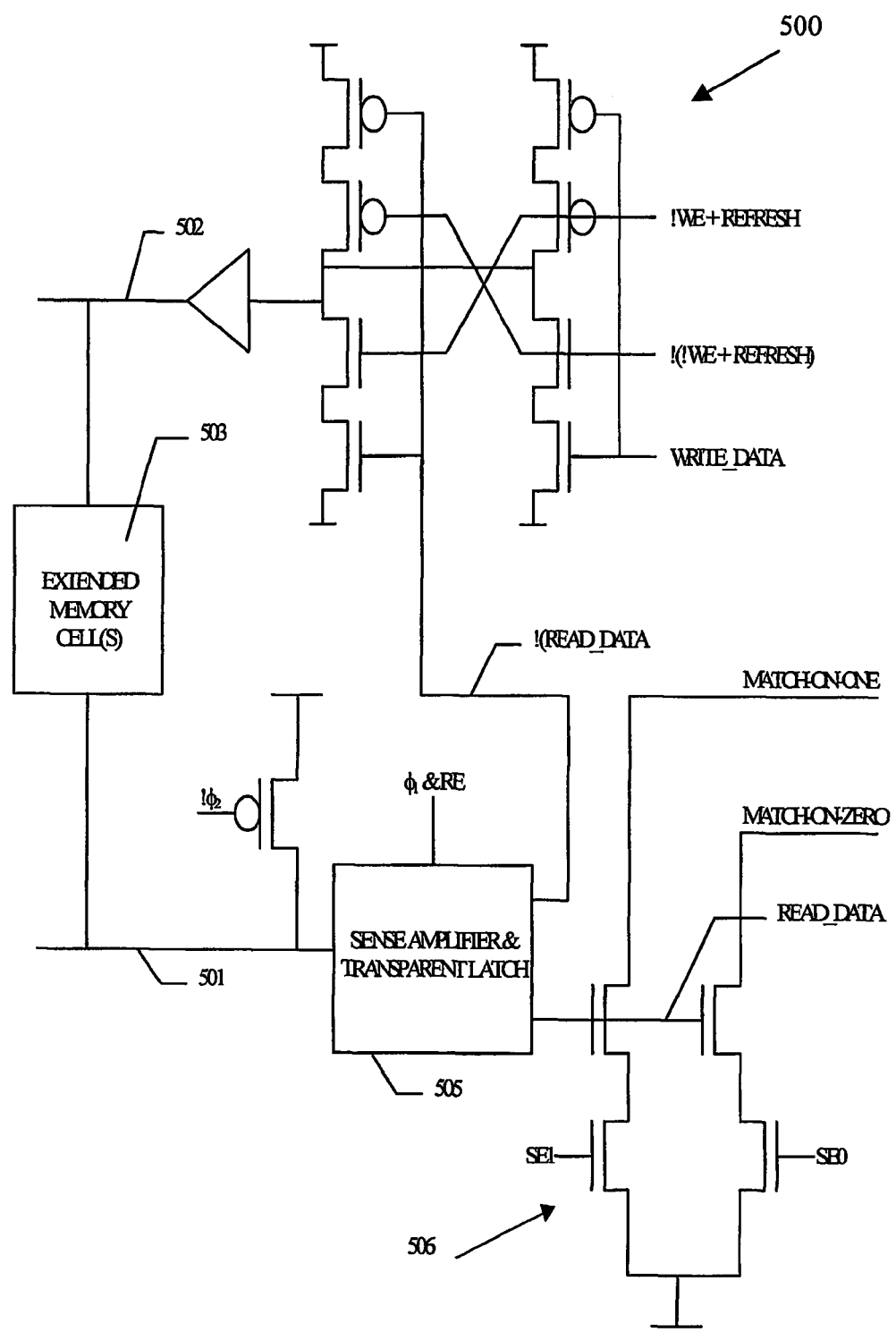
Figure 6 Extended-memory word row adaptor

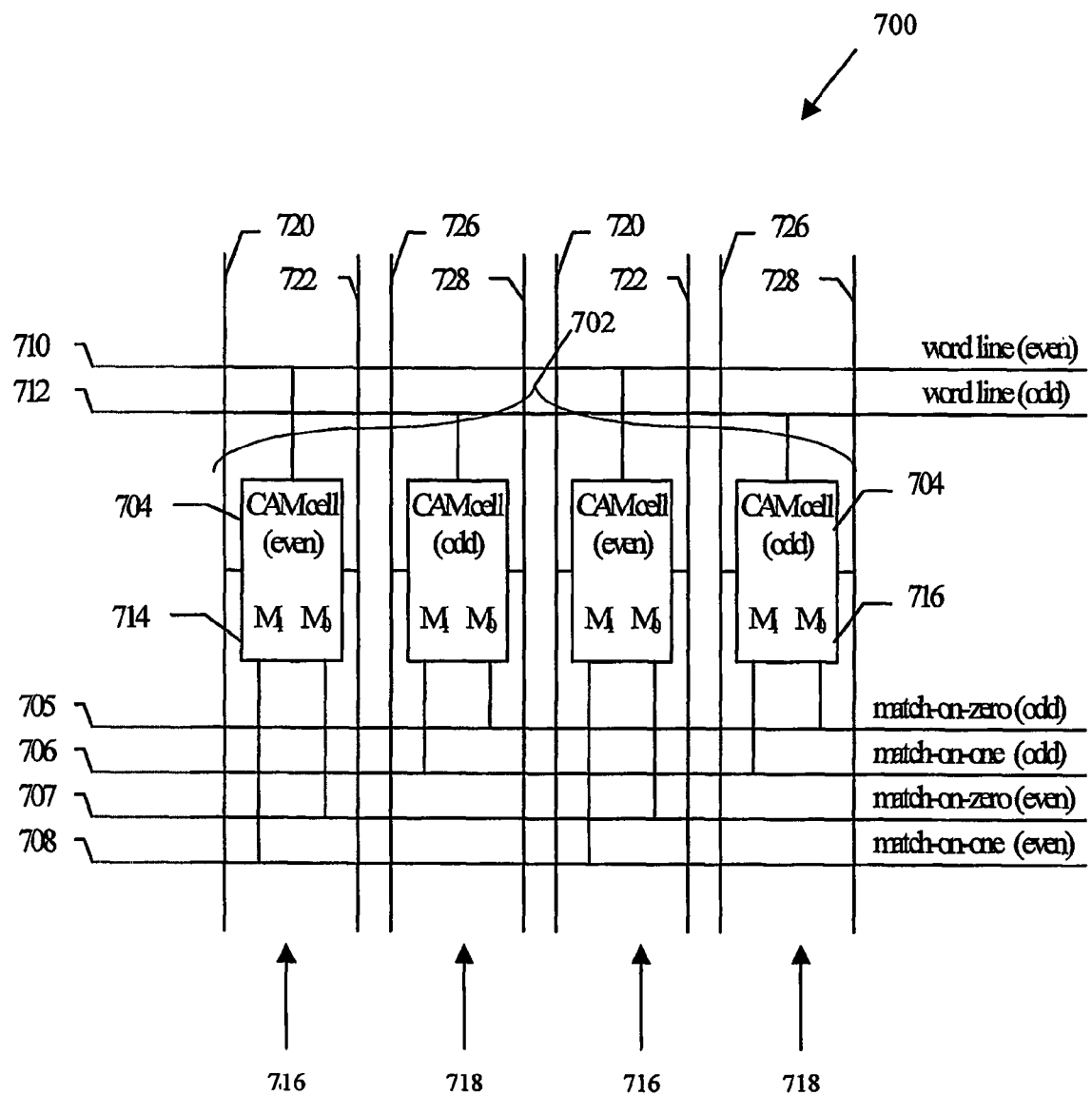
Figure 8 Interleaved memory bits for enhanced numeric capability, improved speed and reduced power

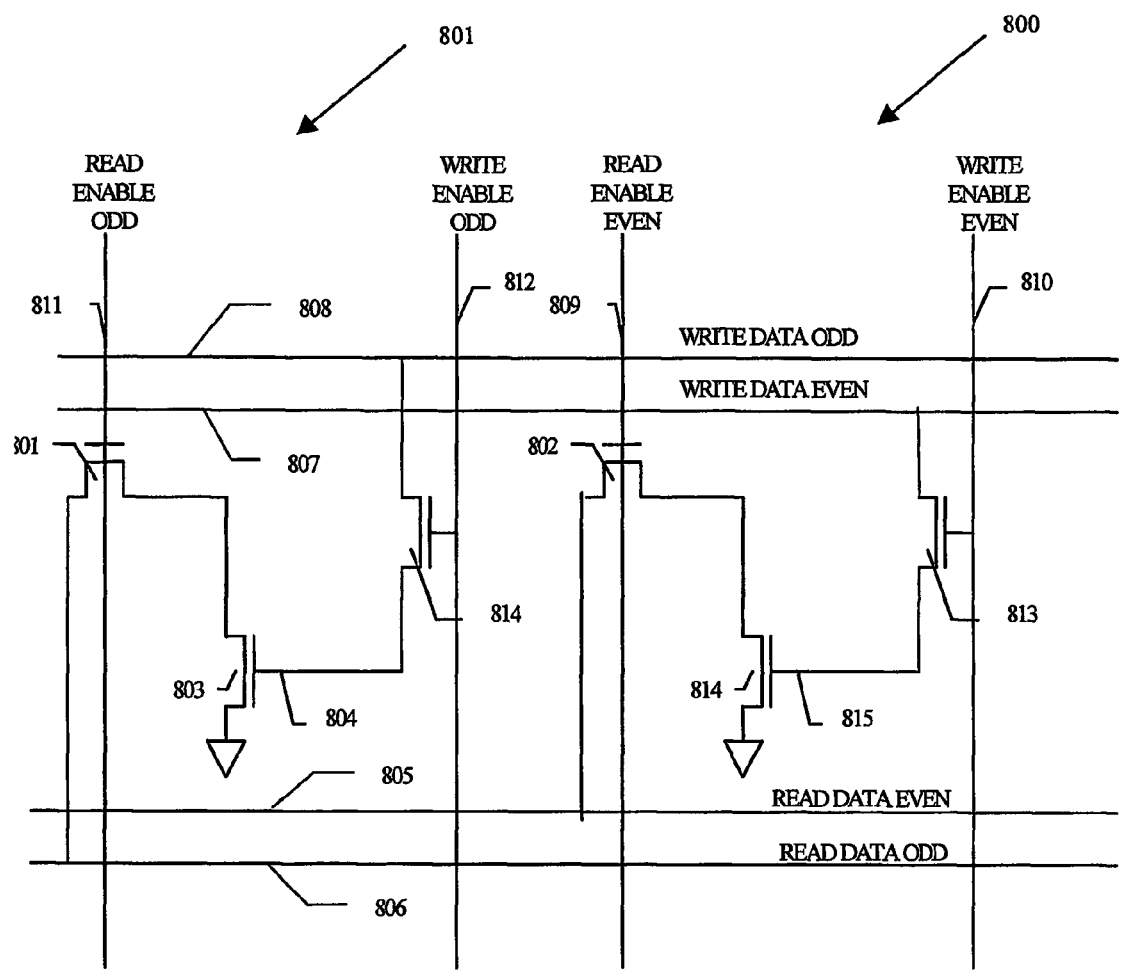
Figure 9 Extended-memory organisation for two-bits-at-a-time operation

CONTENT-ADDRESSABLE (ASSOCIATIVE) MEMORY DEVICES

CROSS REFERENCE TO RELATED APPLICATIONS

This application is a PCT National Phase of International Application No. PCT/GB01/05134 filed Nov. 21, 2001.

FIELD OF THE INVENTION

The present invention concerns improvements relating to Associative or Content-Addressable Memory (CAM) devices and more particularly, though not exclusively, to an improved CAM data memory organisation for use with data-parallel associative processors such as Single Instruction Multiple Data (SIMD) associative data-parallel processors.

BACKGROUND OF THE PRESENT INVENTION

A particular sub-class of SIMD data-parallel processors is known as associative processors. Such processors utilise a class of memory known as associative or content-addressable memory (CAM). Such memories, as the name implies, do not operate by addressing the memory location in the conventional sense, but rather they compare the stored contents of a pre-defined field (or set of bits) of all memory words with a global bit pattern (comprising one or more bits). Those memory words which match the applied pattern during the operation (which is variously known as searching, matching or tagging) are marked in some way (tagged) in order that they might subsequently participate in a later operation which will, in some manner, modify the stored contents of the memory.

The internal organisation of such memories are generally classified into 1. word organised (i.e. memories whereby a bit-parallel pattern may be used as the basis of the search) and the bit-parallel comparison is carried out in a single indivisible operation, or 2. bit-serial (i.e. only a single bit may be used as the basis of the search).

In the latter class of memories, bit-parallel searches may be emulated by repeated application of bit-serial searches.

Some applications of content-addressable memories follow the search phase with a match resolution phase, whereby a single matching memory location is uniquely located (generally the first from the top) and then updated—generally in the form of a conventional memory write cycle.

Applications of content-addressable memory for parallel processing make use of a programmable multi-write opportunity, whereby the many tagged memory words may all (or a selected subset) be updated simultaneously.

The major attributes of such a memory are:
natural parallelism, whereby multiple memory words may be tagged in parallel; natural parallelism, whereby multiple memory words may be subsequently updated or modified in parallel.

Such memories are universally implemented as either bit-serial or word-organised. Some examples of CAM bit-serial and bit-parallel data memories are provided in the following patents: U.S. Pat. No. 4,799,192 which is directed to a three transistor content addressable memory; U.S. Pat. No. 4,833,643 which concerns associative memory cells; U.S. Pat. No. 4,991,136 which is directed to a semiconductor associative memory device with memory refresh during match and read operations; and U.S. Pat. No. 4,965,767 associative memory having simplified memory cell circuitry.

Early instances of the invention have been manufactured for use with the Aspex ASP (Associative String Processor) data parallel processor. The ASP is a SIMD data processor that in typical configurations operates on 1024 to 65536 data items in parallel. Some of the invention's detail is specific to this data processor. The major attributes of the latest version of the ASP are 1152 processing elements on a single device 12.0 mm×12.0 mm in size and 100 MHz clock speed. Future versions of this processor will incorporate up to 8192 processing elements.

Conventional word-organised associative (content-addressable) memory can take many forms but a simple and common exemplary solution is now described with reference to FIG. 1. FIG. 1 shows a simple memory cell 10 which comprises a static RAM cell 12 together with a form of EXNOR network 14, which implements in use an equivalence comparison between the stored state in the RAM cell 12 and a broadcast bit value to be compared with.

The memory write cycle comprises the application of the data and NOT(data) to the bit lines 16 and a strobe on the word line 18. The memory search cycle comprises a pre-charge of the match line 20, with the bit lines 16 held low (to prevent a discharge path to ground), followed by the release of the precharge and the application of the search data (and NOT(data)) onto the bit lines 16. If the stored and applied data are different, then the match line 20 will discharge.

Such an organisation may be configured into a word-organised memory by simply creating a word-array on common match and word lines 18, 20. Any mismatch on any bit(s) will result in the common match line 20 discharging.

Implicit masking of any bit-column during a search cycle can be carried out by holding both the bit lines 16 low. However, there is a significant disadvantage in that this style of memory cell 10 is restricted to unconditional write of all bits of the stored data word, because of the common word line 18 (i.e. masked writes are not possible). If individual fields or bits of the memory word are to be updated, then multi-write (the capability to update more than one word at a time) is impossible. A large number of variants exist for memory cells to fulfil this role but they all suffer from the same problem.

The present invention aims to overcome this problem and provide a far more flexible solution to the existing CAMs 10 described above.

SUMMARY OF THE INVENTION

According to one aspect of the present invention there is provided a compound associative memory for use with a data-parallel computer, the memory comprising: a bit-parallel word-organised associative memory comprising an array of associative memory cells arranged to be capable of bit-parallel search and write operations; a bit-serial associative memory comprising an array of memory cells arranged to be capable of bit-serial search and write operations, but not word bit-parallel search and write operations; wherein the bit-serial memory is operatively connected to the bit-parallel memory and arranged to operated as an extension of the same.

The present invention is able to overcome the problems of the prior art as it is possible to write to specific bits of a data word in the compound associative memory whilst still retaining the ability to carry out data-parallel data searches.

The new associative memory architecture of the present invention, in one embodiment, utilises a conventional three-transistor pseudo-static RAM circuit to provide a very dense memory to augment a 10 transistor pseudo-static CAM cell of a type already used in the inventors' ASP technology.

As mentioned above, the compound memory essentially comprises two banks, one of fully associative (word-organised) content-addressable memory, and the other of bit-serial associative memory. This latter memory bank is referred to as extended memory. In an exemplary embodiment, the two banks share common match lines and common write lines which enables them to function in a unified manner.

This compound memory as a whole is restricted to operations of a bit-serial nature (i.e. it is incapable of sustaining word-organised (bit-parallel) search or write operation). However, the bank of fully associative (word-organised) content-addressable memory retains this capability. The restriction to bit serial memory enables the construction of the extended memory to be simplified there by reducing cost, complexity and power consumption.

Preferably the design of the extended memory organises the three-transistor RAMs so that conventional direction of the memory words is aligned with the memory columns of the word-organised ten-transistor pseudo-static CAM array.

It is to be appreciated that the term column as used herein is intended to mean the direction of columns in the word-organised CAM memory.

The operation of an embodiment of the present invention is now described in overview. When presented with a column address for a search operation, the column of memory cells in the extended memory is accessed. Preferably a sense amplifier at the end of each word row is employed to speed up the detection of the read event, even though the read cycle produces fully restored logic values. The output of the sense amplifier feeds a split EXNOR comparator similar to that employed in each of the fully associative (word-organised) content-addressable memory cells, allowing the memory bank to be coupled directly onto the match lines of the fully associative (word-organised) content-addressable memory. This ensures that the match line behaviour of the compound memory is uniform.

In keeping with the behaviour of the fully associative (word-organised) content-addressable memory, a write-back to the selected column of the extended memory is preferably in the form of a multi-write, wherein a number (between none and all) of memory bits will modified, in those word rows denoted as active as a result of the search.

Those bits in the selected column, which need to be modified, receive a strobe on the word row write line and the global write data is written. Those bits where a strobe on the word row write line does not take place are recirculated and written back (refreshed).

Aspects of the present invention which are highly advantageous are specified below. The present invention provides combined word-organised and bit-serial memories in a single compound memory, allowing several advantageous functions to be carried out, namely:

emulation of bit-serial associative searching and writing behaviour for the entire memory, irrespective of whether the data is contained in the word-organised or extended memory blocks.

associative processing capability whereby the outcome of the search cycle is used to define an active set of word rows to participate in a subsequent multi-write, where the multi-write may occur in either the word-organised CAM or the extended memory (or both), clear or write of selected active bits is implemented by reading the entire column and recirculating the stored data from the non-active bits whilst writing modifying and writing back the new global data value into all the active bits compatibility with the two-bits-at-a-time serial search mode of the second bank of fully associative (word-organised) content-addressable memory, adoption of a conventional three-transistor pseudo-static memory cell as the building block of the bit-serial associative memory, resulting in substantial area and power savings compared to the fully associative (word-organised) content-addressable memory The compound memory is restricted to operations of a bit-serial nature (i.e. it is incapable of sustaining word-organised (bit-parallel) search or write operation). However, the bank of fully associative (word-organised) content-addressable memory retains this capability.

The use of a bit-serial extended memory utilising only three-transistor RAM as associative memory provides significant advantages such as:

Size. The improved density of the extended memory using three-transistor DRAM allows up to three times the density of the word-organised CAM memory.

Speed. The lower bit line capacitance allows the memory to operate at a higher speed than the conventional word-organised CAM to which it is an adjunct. Although this is not readily exploited in a device which implements the dual-memory solution, and dedicated device with only extended memory style CAM would offer higher speed.

Power. The lower bit line capacitance allows the memory to operate at a lower power per operation. This is highly advantageous as in VLSI (Very Large Scale Integration) of the memories there are very large numbers of operations that are carried out.

These benefits open a number of new application areas. The application of this network to VASP processors advantageously allows the architecture to continue to exploit the non-deterministic nature of the associative processor, whilst implementing effective numeric processing of a higher performance per unit area than conventional DSP (Digital Signal Processing) solutions.

The present invention also extends to a method of storing data in a compound associative memory, the method comprising: searching a bit-parallel word-organised associative memory capable of bit-parallel search and write operations and/or a bit-serial associative memory coupled to the bit-parallel memory, which is capable of bit-serial search and write operations, but not word bit-parallel search and write operations, for data matching search data; marking the memory cells having stored data matching the search data; and storing data in at least one of the marked memory cells, wherein the storing step comprises reading data stored in the bit-serial memory and using the read data to control selection of selective bits of the data organised as words in the bit-parallel memory.

According to another aspect of the present invention there is provided a word organised content-addressable memory (CAM) array for use with an associative data-parallel processor, the CAM array comprising: a plurality of CAM cells arranged as a series' of data words, each cell representing a bit of a word, the CAM cells being interconnected in a interleaved manner to define odd and even alternating cells within a data word and being arranged to provide concurrent access to two-bits at a time of data stored in each data word in the CAM array.

This aspect of the present invention provides an improvement over conventional CAM arrays in that by use of the interleaving arrangement it is possible to increase the speed of operation, and enhance the numeric capabilities of the memory.

Preferably, each cell comprises a plurality of match signaling lines for indicating the matching of the stored bit within the cell and predetermined data. This provides a preferred way of exploiting the CAM array to enable the data to be read from different adjacent interleaved pairs of cells concurrently. In fact, in an embodiment of this aspect of the present invention, a CAM array comprised of a plurality of split match line pseudo-static or static-CAM memory cells is used together with interleaved connection of cells in even-odd bit pairs to provide four-bits-at-a-time access to data stored in each word in the CAM array.

In the exemplary embodiment of this aspect of the present invention, exploiting the split match line CAM cell (which gives two-bits-at-a-time numeric access of bits from the memory word) in conjunction with interleaving the bit cells to produce four-bits-at-a-time access into the CAM word, only requires the addition of two extra metal word lines which has no or negligible area impact on the memory array size. This advantageously improves speed by reducing the capacitance on a given bit line, and improves the throughput by effectively doubling the numeric processing by increasing the access to four bits-at-a-time.

The present invention also extends to a method of retrieving multiple bits of data from a data word in a word organised content-addressable memory (CAM) array, the method comprising: carrying out a bit-serial search of a plurality of different columns of memory cells of the CAM array, the search involving masking the data lines to all but the specified plurality of columns of cells and placing complementary search data on the different data lines of the plurality of non-masked columns; matching the complementary search data with data stored in the memory cells; and generating a non-matching signal if the stored data does not match the search data on any of the cells being tested; wherein by virtue of an interleaved interconnection of the CAM cells to matching lines and the use of complementary search data, the non-matching signal is a signal representative of the CAM cell's stored value.

Preferred embodiments of the present invention will now be described by way of example with reference to the accompanying drawings.

BRIEF DESCRIPTION OF THE DRAWINGS

FIG. 1 is a circuit diagram showing the arrangement of a prior-art SRAM-based CAM cell;

FIG. 2 is a schematic block diagram showing an associative memory system showing main and extended memory banks according to a first embodiment of the present invention;

FIG. 3 is a circuit diagram showing an ASP word-organised ten-transistor CAM cell used within the associative memory system shown in FIG. 2;

FIG. 4 is a circuit diagram showing an alternative non-explicit mask CAM cell to that shown in FIG. 3;

FIG. 5 is a circuit diagram showing a three-transistor extended memory cell of the extended memory of FIG. 2;

FIG. 6 is a schematic block diagram showing in detail an extended-memory word row adaptor of FIG. 2; and FIG. 7 is a circuit diagram showing a match-line sense amplifier used in the associative memory system shown in FIG. 2;

FIG. 8 is a schematic block diagram showing an associative memory comprising interleaved memory bits according to a further embodiment of the present invention; and FIG. 9 is a showing an extended-memory organisation for two-bits-at-a-time operation of the further embodiment of the present invention.

DETAILED DESCRIPTION OF THE PREFERRED EMBODIMENTS

A chip content-addressable compound memory 50 according to an embodiment of the present invention is now described with reference to FIG. 2. The memory structure 50 essentially comprises: a word-organised content-addressable memory array (CAM) 52, a memory row interface 54 for interfacing to a SIMD processor for implementing an associative data read/write; a bit-serial extended memory block 56 for supplementing the operation of the CAM array 52 and an extended memory row adaptor 58 for interfacing the extended memory 56 to the CAM array 52. In the present embodiment the CAM array 52 comprises 128 word rows with each word being 64 bits wide. The extended memory 56 comprises words that are column aligned and that are 128 bits wide to match the number of rows in the CAM array 52.

In addition to these main blocks, the CAM array 52 is provided with a bit-line interface controller 60 for selecting bits within data words of the CAM array 52 for reading and writing to. Similarly, the extended memory block 56 has a corresponding column decoder and bit-line controller 62. The extended memory row adaptor 58 also has a global data interface 64 for receiving data on a serial search and writing data to the extended memory block 56.

The extended memory 56 is linked to the CAM array 52 via the extended memory row adaptor 58 and common signal lines, namely a plurality of word row write lines 100, a plurality of match-on-zero lines 101 and a plurality of match-on-one lines 102. In this embodiment there are 128 match-on-zero lines 101, 128 match-on-one lines 102 and 64 word row write lines 100.

The operation of the compound memory 50 is typical broken down into four phases, namely: pre-search; search; activate; and write (or read). Taking each of these in turn, the pre-search phase supports the precharging of the word-aligned match lines 101, 102 and the pre-fetch of the search data. The operation of the compound memory 50 can be either bit-serial or bit-parallel. However, the extended memory block 56 can only be used in bit-serial mode. During the pre-search cycle, the memory bit-column is decoded, by the column decoder and bit-line controller 62, and the search data is registered into the global data interface 64 of the extended memory row adaptor 58. At the same time a bit-parallel search pattern (not shown) is loaded into the CAM bit-line interface controller 60. In the case of a bit-serial operation, only one bit of this pattern contains valid search data.

During the search cycle, if the extended memory block 56 is enabled then the selected column is read out into the extended memory row adaptor 58 (which comprises essentially logic gates) and then propagated to the main memory row interface 54 via the CAM match lines 101, 102. If the extended memory is not active then the search takes place in the main CAM array 52. In this case, the extended memory block 56 is not utilised and therefore can undertake a normal column refresh controlled by external refresh logic.

Although not pertinent to the explanation of the present invention, the results of the search cycle (in the form of match/mismatch indications of the cell match lines 101,102) are propagated via the memory row interface 54 and stored into appropriate registers in the adjacent word logic. Matching word rows are said to be tagged.

During the activate cycle, a programmable mapping between tagged and active word rows is effected. The interval is also used to implement a column refresh in the extended memory 56 under control of external refresh logic (not shown) and a block refresh in the pseudo-static CAM (described in detail below).

During the write cycle, the active word rows participate in a multi-write. The word row write enables 100 of active word rows become true. If the write operation is designated to take place in the CAM array 52, then the bit-parallel write pattern presented to the bit-line control logic is written into the designated words. The ability of the bit-line controller 60 to mask bits from the write operation enables the CAM array 52 to emulate bit-serial operations (where only one bit is written) or to undertake a flexible set of bit-parallel write options.

If the CAM array 52 is selected, then a direct read of the stored data can also take place. Under these circumstances it is required that only one word row of the memory should be enabled. Such an option can easily be implemented. A number of conventional CAM solutions provide a match resolver to select the first matching word row, which is then used to generate an row address for subsequent read or write. A variant on this scheme may be used to make (say) only the first word row active for a read cycle.

If the write operation is designated to take place in the extended memory block 56 (bit-serial only), then the CAM bit-lines are usually all masked by the bit-line controller 60. During an extended memory write operation, the column to be written is first read out into the extended memory word row adaptor 58. Those bits in the column which are to write data, receive a strobe on the word lines 100 only in active word rows and the bit-serial write data is distributed and written to each bit. Those bits where a strobe event on the write line does not take place have their pre-read data recirculated and written back—identical to the behaviour during a refresh. Such behaviour emulates the other feature of an associative processor, namely the multi-write of selected word rows.

It is to be appreciated that word-oriented read operations of the extended memory block 56 cannot take place.

Referring now to FIG. 3, an example of an ASP word-organised memory cell 200 that is used in the CAM array 52 of the present embodiment is now described. This class of memory cell 200 can be seen (with minor variations) in the VASP-256 and VASP-1024 data-parallel processors by the present applicant. There are several features of the implementation of note. Firstly, the memory cells 200 are of an all NMOS construction, which leads to a higher density of cells. Secondly, this type of memory cell 200 enables explicit masking of the write operation to allow selected bits of the memory word(s) to be updated—thereby allowing the emulation of bit-serial operation, combined with multi-write capability, which is an essential feature in the operation of the CAM as part of an associative processor. Thirdly, the memory cells utilise split match lines. This feature allows the creation of separate match-on-zero ($M_0$) and match-on-one ($M_1$) indicators, which improve the functionality of the memory cell as will be explained later.

The operation of this circuit during a write cycle is now described. The write cycle requires the data to be applied to net 203 and NOT(data) to net 204. A valid write enable must be stable and applied to net 205 before the word line 206 of the cell column is strobed, and it must be retained until after the strobe is negated. Only cells 200 in bit-columns whose write enable net 205 is driven to $V_{CC}$ will be modified with a word whose word line 206 is strobed.

The maximum voltage which can be stored on either net 201 or 202 is limited to one threshold below the supply, given that signals on nets 203, 204, 205 and 206 are driven to the fixed positive supply potential $V_{CC}$.

Refresh of this pseudo-static arrangement can be affected by setting the signal voltages on the nets 203, 204, and 205 to be equivalent to the supply, namely equal to $V_{CC}$ and then strobing the word line 206 as per a write cycle. The state of nets 203 and 204 must be sustained at or near $V_{CC}$ by restoring drivers of sufficiently high gain so as to be sensibly unaffected by the current drain though nets 201 or 202, whichever is storing data 0. Because the memory cell 200 is effectively self restoring under the conditions where the voltages on the nets 203, 204, 205 and 206 are equivalent to the supply voltage namely $V_{CC}$, then an opportunity exists to undertake a simultaneous refresh of more than one word row. In parallel processing configurations, where CAMs comprising several thousand words may be found, the requirement to refresh each word separately may lead to significant numbers of lost machine cycles in order that the external refresh logic can introduce refresh cycles with sufficient frequency so as to retain the stored state of the entire memory. By refreshing a number of words simultaneously in this manner (say 16), the percentage of lost cycles is reduced. However, such a multi-row refresh can only be sustained if the state of nets 203 and 204 can be held at or near $V_{CC}$ by restoring drivers of sufficiently high gain so as to be sensibly unaffected by the current drain imposed by multiple memory cells enabled for refresh simultaneously. Moreover the dissipated power during the refresh cycle will be substantially higher.

The operation of the circuit during a search cycle requires a match-on-one line 207 and match-on-zero line 208 to be precharged to the fixed positive supply potential $V_{CC}$, whilst ensuring that the bit lines 203 and 204 are held at ground potential.

The application of TRUE data (where net 203 has a voltage equivalent to $V_{CC}$, and net 204 has a voltage equivalent to GND (ground)) to a memory cell storing a data value of zero (i.e. net 201 has a voltage equivalent to GND, and net 202 has a voltage equivalent to $V_{CC}$-$V_T$) will result in the discharge of the match-on-one line 207, indicating a mismatch for search data TRUE.

The application of FALSE data (where net 203 has a voltage equivalent to GND, and net 204 has a voltage equivalent to $V_{CC}$) to a memory cell storing a data value of one (i.e. net 201 has a voltage equivalent to $V_{CC}$-$V_T$, and net 202 has a voltage equivalent to GND) will result in the discharge of match-on-zero line 208, indicating a mismatch for search data FALSE.

All other valid search conditions (including a masked search where net 203 and net 204 each have a voltage equivalent to GND) will result in the match lines remaining precharged—indicating a matching search.

An example of this kind of bit-parallel content addressable memory is found in the VASP-1024 data-parallel processor comprising a 64-bit by 1024 word memory array.

A variant of the CAM described above in the first embodiment is now described as a second embodiment of the present invention with reference to FIG. 4. This embodiment is very similar to the first embodiment and so only the differences will be described hereinafter to avoid unnecessary repetition. The major difference is that the CAM memory cell 300 and the CAM array 52 are different as is the way in which the CAM array 52 is configured to effect a associative bit-write operation.

The variant 300 of the CAM cell 200 shown in FIG. 3 removes the requirements for an explicit column write enable 205 for each column of the CAM array 52, although at the expense of a higher power requirement during masked write operations.

The operation of this memory cell circuit 300 during a write cycle requires the data to be applied to net 303 and NOT(data) to net 304. The word line 306 is strobed, and it must be retained until after the strobe is negated. Those cells 300 where no write is required have lines 303 and 304 set to the positive supply potential $V_{CC}$ to effect a so called 'non-explicit' masking of the cell. This works because the cell is a pseudo-static cell which does not change state when there is no charge difference between its data line inputs. These cells 300 undertake an automatic and user transparent self-refresh operation.

However, given that the number of cells 200 undertaking this form of transparent self refresh is non-deterministic and may vary from none to all, the ability to control the substantially higher power generated during this operation is limited, unlike the normal refresh (see below). Consequently, this places a sensible upper limit on the use of this memory variant, despite the area saving due to the removal of two transistors and a column write enable 205.

The maximum voltage which can be stored on either net 301 or 302 is limited to one threshold below the supply, given that signals on nets 303, 304 and word line 306 are driven to the fixed positive supply potential $V_{CC}$.

Refresh of this pseudo-static arrangement can be effected by setting the signal voltages on the nets 303 and 304 to be equivalent to the positive supply, namely equal to $V_{CC}$ and then strobing the word line 306 as per a write cycle. The state of nets 303 and 304 must be sustained at or near $V_{CC}$ by restoring drivers of sufficiently high gain so as to be sensibly unaffected by the current drain though nets 301 or 302, whichever is storing data 0. Because the cell 300 is effectively self-restoring under the conditions the voltages on the nets 303, 304, and 306 are equivalent to the supply voltage namely $V_{CC}$, then an opportunity exists to undertake a simultaneous refresh of more than one word row. In a parallel processing configurations, where CAMs comprising several thousand words may be found, the requirement to refresh each word separately may lead to significant numbers of lost machine cycles in order that the external refresh logic can introduce refresh cycles with sufficient frequency so as to retain the stored state of the entire memory. By refreshing a number of words simultaneously in this manner (say 16), the percentage of lost cycles is reduced. However, such multi-row refresh can only be sustained if the state of nets 303 and 304 can be held at or near $V_{CC}$ by restoring drivers of sufficiently high gain so as to be sensibly unaffected by the current drain imposed by multiple memory cells 300 enabled for refresh simultaneously. Moreover the dissipated power during the refresh cycle will be substantially higher.

An example of this kind of bit-parallel content addressable memory is found in the VASP-256 data parallel processor, which comprises a 64-bit by 256 word memory array.

FIG. 5 shows a well-known three-transistor memory cell circuit 400 that is used for the cells of the extended memory 56 in the compound associative memory 50 of the present embodiment. However, unlike the conventional orientation of this cell 400, the read and write enable lines 405, 406 are aligned to the memory column, whilst the read and write data lines 403, 404 are aligned with the memory row.

The operation of this cell 400 during a write cycle comprises the application of write data in signal 403, accompanied by a strobe cycle on the write enable line 406. The hold requirements of signal 403 with respect to signal 406 must be adhered to. The write data and write enable lines 403, 406 are driven to the fixed positive supply potential $V_{CC}$ during a write (or refresh) cycle. The data stored on node 402, the gate of device 407, is limited to one threshold below the supply, which is sufficient to exceed the 'on' threshold of device 407 for a valid read event.

During a read cycle, the read data line 404 is precharged. Once the precharge is released, the read enable line 405 is asserted. A logical 'one' stored at node 402 ($V_{CC}$-$V_T$) will enable a discharge path for the read data line 404. A logical 'zero' stored at node 402 will disable the discharge path and leave the read data line 404 precharged. Effectively this signal represents NOT(data).

Variations on this cell, wherein the read transistors 407, 408, connected between the READ DATA line and ground, are reversed in order are well known and well documented.

Referring now to FIG. 6, the Memory Row Interface Adaptor 58, which interfaces the extended memory 56 to the CAM array 52, is shown. This adaptor 58 serves the diverse purposes of:

1. carrying out a qualified precharge of the read net,
2. carrying out sense-amplification of the read net data,
3. latching of the read data for timing consistency during refresh/rewrite cycles and
4. implementing EXNOR behaviour which ensures signal compatibility with the match-on-zero and match-on-one match lines 207, 208 of the CAM array 52.

The overall timing of the extended memory array 56 is qualified by two timing phases, $\phi_1$ and $\phi_2$ which are used to regulate the access to the read and write data lines 403, 404. The general timing is:

1. $\phi_1$ qualifies a read event
2. $\phi_2$ qualifies a write/refresh event and also the read line precharge.

During the first phase $\phi_1$, a memory cell 503 of the extended memory 56 is enabled to read its data onto a read data line 501. This information is sensed by a transparent latch 505, which is also enabled by the first phase $\phi_1$, and whose input stage is appropriately ratioed to provide a switching point around 65% of the fixed supply voltage. Under all circumstances the read line 501 will have been precharged.

During a search cycle, the resulting READ_DATA is used as the input to the EXNOR networks 506, which ensure signal compatibility with the match-on-zero and match-on-one match lines 207, 208 of the CAM array 52. The READ_DATA is gated with a signal SE1 (Search Enable 1, a signal created from the logical AND of search enable and the complement of the global bit-serial search data digit) to generate the MATCH-ON-ONE output. This output is directly coupled onto the equivalent match signal 207 in the corresponding CAM array word row. Similarly the READ_DATA is gated with a signal SE0 (search enable 0, a signal created from the logical AND of search enable and the bit-serial search data digit) to generate the MATCH-ON-ZERO output. This output is also directly coupled onto the equivalent match signal 208 in the corresponding CAM array word row.

At the same time an opportunistic refresh of the extended memory column is enabled, wherein the READ_DATA is recirculated onto the write data line 502 to be re-written into the memory cell 503 whose WRITE ENABLE (see FIG. 3) strobe is derived from the column address qualified with the second phase $\phi_2$.

During a write event, the cycle commences with a column read during the first phase $\phi_1$. The memory cell 503 is enabled to read its data onto the read data line 501. This information is sensed by the transparent latch 505, which is also enabled by the first phase $\phi_1$, and whose input stage is appropriately ratioed to provide a switching point around 65% of the fixed supply voltage.

Under all circumstances the read line 501 will have been precharged by the second phase $\phi_2$. The role of the transparent latch 505 is to retain the data read during the first phase $\phi_1$ throughout the second phase $\phi_2$ (the writeback) when the read line 501 has become invalid due to the precharge.

During the second phase $\phi_2$, a word row which has been denoted to be active (see above) has its word enable (WE) line asserted. In the absence of a refresh (i.e. REFRESH=0), the global WRITE_DATA will be driven onto the write data line 502 to be written into the memory cell 503 whose WRITE ENABLE (see FIG. 3) strobe 205 is derived from the column address qualified with the second phase $\phi_2$. At the same time, a word row which has been denoted to be inactive (see above) has its word enable (WE) line de-asserted. In this case the READ_DATA is recirculated onto the write data line 502 to be re-written into the memory cell 503 as before.

The present embodiment of the invention allows the conventional 3-transistor DRAM memory cell 503 to emulate the behaviour of the word-organised CAM 52 (when operating in serial mode) in all respects, including:

1. split match line (match-on-zero and match-on-one) behaviour during search;
2. masked search; and
3. multi-write of data only in active word-rows.

Operation of the extended memory 56 is limited to single bit access. Operation of the overall memory system (i.e. the compound memory 50 comprising extended memory 56 and CAM array 52) in two-bits-at-a-time serial mode (i.e. arithmetic) can only support access to one bit from the extended memory 56 and one bit from the CAM array 52.

Referring to FIG. 7, a match line sense amplifier 600 is shown which a component of the memory row interface 54. This is used to enhance the evaluation of the implementation. As can be seen, each match line 207, 208 is routed via the simple sense amplifier network 600, which comprises a ratioed inverter set to between 65% and 75% of the supply voltage ($V_{CC}$) depending upon the local match line load. This permits the equalisation of the mismatch discharge period across multiple match lines 207, 208.

The output of the sense amplifier 600 is used to gate the pull-down of an independent precharged match output net for circuit specific reasons. The precharge device for the primary match line is mirrored by a discharge device which is utilised to ensure that the match lines 207, 208 do not retain charge outside of valid search events, which can be the basis of induced cross-talk paths.

In both the first and second embodiments, the role of split match lines 207, 208, 307, 308 in numeric processing in the associative processor is now discussed.

By offering split match lines (match-on-one—$M_1$, and match-on-zero—$M_0$) in the above described embodiments, the data-parallel associative processor (not shown) is actually able to efficiently emulate two-bits-at-a-time access of column data from the CAM 52.

This is performed by ensuring that a bit-serial search is performed on two columns, with all other columns masked. One column must be searched with data 0 and the other with data 1. Generally the nominated bit columns represent corresponding bits from two separate (or contiguous) fields of the memory word which are allocated to different operands (e.g. operand A and operand B) as shown below:

| operand A | operand B | word row n |
| operand A | operand B | word row n + 1 |
| operand A | operand B | word row n + 2 |
| operand A | operand B | word row n + 3 |

For that column searched with data 1 (where net 203=$V_{CC}$, net 204=GND), then:

1. Only the match-on-one line 207 can possibly discharge;
2. If data stored is '1', then the search yields a match and the precharged match-on-one line 207 remains precharged at $V_{CC}$ ('1'); and
3. If data stored is '0', then the search yields a mismatch and the precharged match-on-one line 207 is discharged to GND ('0').

Thus the stored memory column is effectively read out onto the match-on-one line 207.

For that column searched with data 0 (where net 203=GND, net 204=$V_{CC}$), then:

1. Only the match-on-zero line 208 can possibly discharge;
2. If data stored is '0', then the search yields a match and the precharged match-on-zero line 208 remains precharged at $V_{CC}$ ('1'); and
3. If data stored is '1', then the search yields a mismatch and the precharged match-on-zero line 208 is discharged to GND ('0').

Thus the complement of the stored memory column is effectively read out onto the match-on-zero line 208.

Referring now to FIG. 8. A third embodiment of the present invention is described. Again for the avoidance of unnecessary repetition, only the differences between the first and third embodiments of the present invention are discussed hereinafter.

The major difference between the above-mentioned embodiments is that the third embodiment comprises interleaved memory bits in the word-organised CAM array 52, 700. The purpose of such an arrangement is to improve (reduce) power dissipation, and to enhanced arithmetic capability of the compound memory 50 (or an associative processor using the memory). More specifically, the CAM words 702 comprising a plurality of CAM cells 704 are organised on an odd/even interleaved basis, with split match lines 706, 707, 708, 709 and split word lines 710, 712.

Each even memory cell 704, 714 in the CAM word 702 has its split match cell outputs (match-on-one—$M_1$, and match-on-zero—$M_0$), only attached to the even match lines (707 and 708). Even bits can participate in two-bits-at-a-time access of column data from the even bits of the CAM 700.

This is performed by ensuring that a bit-serial search is performed on any two even columns 716, with all other columns (except for the two columns 718 nominated as odd—see below) masked. One column 716 is searched with data 0 and the other 716 with data 1. Generally the nominated bit columns 716 are corresponding bits from fields of the memory word 702 allocated to different operands.

For that column 716 searched with data 1 (where the data lines 720=$V_{CC}$, 722=GND), then:

1. Only match-on-one (even) 708 can possibly discharge.
2. If data stored is '1', then the search yields a match and the precharged match-on-one (even) line 708 remains precharged at $V_{CC}$ ('1').
3. If data stored is '0', then the search yields a mismatch and the precharged match-on-one (even) line 708 is discharged to GND ('0').

Thus the stored memory column 716 is effectively read out onto the match-on-one (even) line 708.

For that column searched with data 0 (where the data lines 720=GND, 722=$V_{CC}$), then:

1. Only match-on-zero (even) 707 can possibly discharge.
2. If data stored is '0', then the search yields a match and the precharged match-on-zero (even) line 707 remains precharged at $V_{CC}$ ('1').
3. If data stored is '1', then the search yields a mismatch and the precharged match-on-zero (even) line 707 is discharged to GND ('0').

Thus the complement of the stored memory column 716 is effectively read out onto the match-on-zero (even) line 707.

Each odd memory cell 704,724 in the CAM word 702 has its split match cell outputs (match-on-one—$M_1$, and match-on-zero—$M_0$), only attached to the odd match lines 705, 706. Odd bits can participate in two-bits-at-a-time access of column data from the odd bits of the CAM 700.

This is performed by ensuring that a bit-serial search is performed on any two odd columns, with all other columns 718 (except for the two columns 716 nominated as even—see above) being masked. One column 718 must be searched with data 0 and the other 718 with data 1. Generally the nominated bit columns are corresponding bits from fields of the memory word 702 allocated to different operands.

For that column 718 searched with data 1 (where the data lines 726=$V_{CC}$, and 728=GND), then:

1. Only match-on-one (odd) 706 can possibly discharge.
2. If data stored is '1', then the search yields a match and the precharged match-on-one (odd) line 706 remains precharged at $V_{CC}$ ('1').
3. If data stored is '0', then the search yields a mismatch and the precharged match-on-one (odd) line 706 is discharged to GND ('0').

Thus the stored memory column 718 is effectively read out onto the match-on-one (odd) line 706.

For that column searched with data 0 (where the data lines 726=GND, and 728=$V_{CC}$), then 1. Only match-on-zero (odd) 705 can possibly discharge.
2. If data stored is '0', then the search yields a match and the precharged match-on-zero (odd) line 705 remains precharged at $V_{CC}$ ('1').
3. If data stored is '1', then the search yields a mismatch and the precharged match-on-zero (odd) line 705 is discharged to GND ('0').

Thus the complement of the stored memory column 718 is effectively read out onto the match-on-zero (even) line 705.

The present embodiment allows the CAM word 702 to effectively operate in bit-serial mode, whilst allowing simultaneous access to up to four bits 704 at a time from a given memory word 702. This enables four bits at-a-time arithmetic and logical operations to be implemented. The resulting design also has the benefits:

1. no (or no significant) area penalty in the memory cell 704; and 2. a modest power penalty, due only to the extra metal capacitance associated with the additional pair of match lines. However the match line connections overall (i.e. the source-drain areas attached to the match lines) which constitute the largest contribution of capacitance—and therefore power—remains constant. Moreover in conventional 1-bit-at-a-time or 2-bits-at-a-time operation, the search match-line power dissipation is halved due to the reduced capacitance on any given match line.

The resulting four match lines can then be propagated to either:

1. A two-bit adder/ALU (not shown), or
2. A single adder/ALU (not shown) which is time multiplexed to produce a two-bit result.

This embodiment is applicable whichever implementation is adopted. It is also to be appreciated that the interleaved word-organised CAM array 700 does not necessarily have to be implemented in a compound memory 50 as has been described above. It can be used as an improved but non-extended associative memory for a data-parallel processor.

Consistent with the requirements of two-bits-at-a-time or four-bits-at-a-time operation of the word-organised CAM (when operating in bit-serial mode), the extended memory cell can be enhanced to support dual-port access as is now described with reference to FIG. 9. Which shows a modified extended memory cell 800. Layout benchmarks show that this design is only some 12% larger than the single-port equivalent, whilst offering a 100% improvement in arithmetic processing throughput.

The extended memory block 56 comprises an array of even and odd memory cells 800, which enable two bits at-a-time operation. Taking each of these in turn:

The operation of each memory cell 800 wired as an even bit during a write cycle comprises the application to that cell 800 of even-bit write data in signal 807, accompanied by a strobe cycle on the even write enable line 810. The hold requirements of data on 807 with respect to 810 must be adhered to. The even write-data and even write enable lines 810, 807 are driven to the fixed positive supply potential $V_{CC}$ during a write (or refresh) cycle. The data stored on node 815, the gate of device (FET) 814, will be limited to one threshold below the supply, which is sufficient to exceed the on threshold of device 814 for a valid even or odd read event.

During an even read cycle, the even read data line 805 is precharged. Once the precharge is released, the even read enable is asserted on line 809. A logical 'one' stored on 815 ($V_{CC}$-$V_T$) will enable a discharge path via the device 802 for the even read data line 805. A logical 'zero' stored on 815 will disable the discharge path via the device 802 and leave the read data net 805 precharged. Effectively this signal represents NOT(data).

The operation of each memory cell 801 wired as an odd bit during a write cycle comprises the application of odd-bit write data in signal 808, accompanied by a strobe cycle on the odd write enable line 812. The hold requirements of data on 808 with respect to 812 must be adhered to. The odd write data and odd write enable lines 808, 812 are driven to the fixed positive supply potential $V_{CC}$ during a write (or refresh) cycle. The data stored on node 804, the gate of device 803, will be limited to one threshold below the supply, which is sufficient to exceed the 'on' threshold of device 803 for a valid even or odd read event.

During an odd read cycle, the odd read data line 806 is precharged. Once the precharge is released, the odd read enable is asserted on line 811. A logical 'one' stored on 804 ($V_{CC}$-$V_T$) will enable a discharge path via the device 802 for the odd read data line 806. A logical 'zero' stored on 804 will disable the discharge path via the device 802 and leave the read data net 806 precharged. Effectively this signal represents NOT(data).

The operation of these memory cells 800 and 801 is complemented with a duplication of the memory row interface adaptor circuit shown in FIG. 6. This sustains the search, write and refresh behaviour of the two-bit (word-parallel, bit-serial) DRAM access, whilst coupling to the four match lines 796, 707, 708, 709 available in the CAM 700 to implement the overall compound memory search behaviour.

Search and write access of the extended memory is limited to two bits at-a-time. Operation of the overall memory system (i.e. the compound memory comprising extended memory and CAM) in four bits-at-a-time serial mode (i.e. arithmetic) can only support access to two bits from extended memory and two bits from the CAM (or all four bits from the CAM).

The compound memory 50 has been implemented in a VASP-1024 chip with 64 bits of extended memory, together with one-bit-at-a-time associative access combined with two-bits-at-a-time CAM.

Having described particular preferred embodiments of the present invention, it is to be appreciated that the embodiments in question are exemplary only and that variations and modifications such as will occur to those possessed of the appropriate knowledge and skills may be made without departure from the spirit and scope of the invention as set forth in the appended claims.

The invention claimed is:

1. A compound associative memory for use with a data-parallel computer, the memory comprising:
   a bit-parallel word-organized associative memory comprising an array of associative memory cells arranged to be capable of bit-parallel search and write operations, and a plurality of write enable lines aligned transversely with the organization of memory cells into words in the bit-parallel memory;
   a bit-serial associative memory arranged to operate as an extension of the bit-parallel memory, the bit-serial memory comprising an array of memory cells arranged to be capable of bit-serial search and write operations, but not word bit-parallel search and write operations; and
   configuring means for operatively connecting the bit-serial memory to the bit-parallel memory, the configuring means being arranged to read word data stared in the bit-serial memory and use the read word data to control selection of selective bits of the data organized as words in the bit-parallel memory selecting write enable lines in the bit-parallel bit-memory.

2. A compound associative memory according to claim 1, wherein the organization of memory cells into words in the bit-serial memory is aligned transversely wit the organization of memory cells into words in the bit-parallel memory.

3. A compound associative memory according to claim 1, wherein at least one dimension of the array of the bit-serial associative memory is equivalent to a dimension of the array of the bit-parallel word organized memory.

4. A compound associative memory according to claim 1, wherein the memory cells of the data-parallel memory comprise pseudo-static CAM cells and bit-parallel memory comprises a data bit controller for controlling the data supplied to the cells of the bit-parallel memory via a plurality of data bit lines, wherein the controller is arranged to selectively mask off cells representing bits of a word in the bit-parallel memory in a non-explicit manner.

5. A compound associative memory according to claim 1, wherein the configuring means comprises a row adaptor and convertor for converting the control signals of the bit-parallel memory to control signals suitable for use with the bit-serial memory.

6. A compound associative memory according to claim 5, wherein the row adaptor and convertor comprises an amplifier at the end of each word row for amplify the read data from cells of the bit-serial memory.

7. A compound associative memory according to claim 5, wherein the row adaptor and convertor comprises an exclusive OR comparator for generating matching signals compatible with matching signals of the bit-parallel memory.

8. A compound associative memory according to claim 5, further comprising a global interface coupled to the row adaptor means for inputting data into the bit-serial memory via the row adaptor means.

9. A compound associative memory according to claim 1, wherein each cell of the bit-serial memory comprises a low-power three transistor pseudo-static RAM circuit.

10. A compound associative memory according to claim 9, wherein the RAM circuit comprises read and write enable control lines aligned to a column orientation of the memory cell and read and write data lines aligned to a row orientation of the memory cell.

11. A compound associative memory according to claim 9, wherein the RAM circuit for each cell comprises a plurality of read enable control lines, a plurality of write enable control lines, a plurality of read data lines and a plurality of write data lines coupled to the circuit.

12. A compound associative memory according to claim 1, wherein each cell of the bit-parallel memory is coupled to a plurality of match signaling lines, each line indicating a mismatching result of a data bit or data word search process within the bit-parallel memory.

13. A compound associative memory according to claim 12, wherein the plurality of match signaling lines are coupled to the bit-serial memory to indicate mismatching results of a data bit search within the bit-serial memory.

14. A compound associative memory according to claim 13, wherein the memory cells of the bit-serial memory are arranged to operate in a similar manner to the bit-parallel memory such that a plurality of bits corresponding to the number of match signaling lines can be retrieved simultaneously from the bit-serial memory in a single indivisible operation.

15. A compound associative memory according to claim 1, wherein the bit-parallel memory is arranged to support a two-bits-at-a-time serial data search mode and the bit-serial memory is arranged to support a compatible two-bits-at-a-time serial data search mode.

16. A compound associative memory according to claim 1, further comprising control means arranged to control use of the bit-serial and bit-parallel memories to carry out bit-serial associative searching and writing procedures for both the bit-serial and bit-parallel memories.

17. A compound associative memory according to claim 16, wherein the control means is arranged to carry out a clear or write operation of selective active cells of the bit-serial memory by reading an entire column of the bit-serial memory, recirculating the stored data from non-active cells of the bit-serial memory and overwriting the data in each of the active cells with a global bit data.

18. A compound associative memory according to claim 1, further comprising associated processing means arranged to use the results of a bit-serial search cycle to define an active set of word row locations to participate in a subsequent multiple write operation in the bit-parallel memory and/or the bit-serial memory.

19. A combination of a data parallel processor and a compound associative memory according to claim 1.

20. A compound associative memory according to claim 1, wherein the bit-parallel memory comprises a content-addressable memory (CAM) array for use with an associative data-parallel processor, the CAM array comprising a plurality of CAM cells arranged as a series of data words, each cell representing a bit of a word, and a plurality of data lines to each cell of the array, each data cell being provided with complementary value data lines, wherein the CAM cells are interconnected in an interleaved manner to define odd and even alternating cells within a data word and being arranged to provide concurrent read access to multiple bits of data stored in the data word.

21. A word organized content-addressable memory (CAM) array for use with an associative data-parallel processor, the CAM array comprising:
   a plurality of CAM cells arranged as a series of data words, each cell representing a bit of a word, and a plurality of data lines to each cell of the array, each data cell being provided with complementary value data lines;
   wherein the CAM cells are interconnected in an interleaved manner to define odd and even alternating cells within a data word and being arranged to provide concurrent read access to multiple bits of data stored in the data word.

22. A CAM array according to claim 21, wherein each cell comprises a plurality of match signaling lines for indicating the matching of the stored bit within the cell and predetermined data.

23. A CAM array according to claim 22, wherein each cell is connected to a match on one output line for signaling when the stored data hit within the cell is not the same as a logical one, and a match on zero output line for signaling when the stored data bit within the cell is not the same as a logical zero.

24. A CAM array according to claim 21, wherein pairs of adjacent alternate cells (even or odd) are arranged to be compared to complementary data signals to carry out non-conflicting data reads of the adjacent alternate cells.

25. A CAM array according to claim 24, wherein adjacent alternate cells are arranged be read simultaneously.

26. A CAM array according to claim 21, wherein the CAM array further comprises a plurality of word enable control lines for enabling a series of cells comprising a word within the array.

27. A CAM array according to claim 26, wherein each cell is arranged to receive a single word enable control line and each word enable control line is arranged to connect to adjacent alternate memory cells.

28. A CAM array according to claim 21, wherein each word of the memory is provided in a row and the memory further comprises means for masking off columns of cells to enable specific bits of a data word to be read.

* * * * *

UNITED STATES PATENT AND TRADEMARK OFFICE
CERTIFICATE OF CORRECTION

PATENT NO. : 7,096,318 B2
APPLICATION NO. : 10/432307
DATED : August 22, 2006
INVENTOR(S) : Jalowiecki et al.

It is certified that error appears in the above-identified patent and that said Letters Patent is hereby corrected as shown below:

Col. 15, Claim 1, line 49 "data stared in" should read as -- data stored in --
Col. 15, Claim 1, line 52 "memory selecting write" should read as -- memory by selecting write --
Col. 15, Claim 1, line 53 "bit memory" should read as -- by memory --
Col. 15, Claim 2, line 56 "transversely wit the" should read as -- transversely with the --
Col. 18, Claim 23, line 7 "stored data hit within" should read as --stored data bit within --

Signed and Sealed this

Twelfth Day of June, 2007

JON W. DUDAS
*Director of the United States Patent and Trademark Office*

UNITED STATES PATENT AND TRADEMARK OFFICE
CERTIFICATE OF CORRECTION

PATENT NO. : 7,096,318 B2  
APPLICATION NO. : 10/432307  
DATED : August 22, 2006  
INVENTOR(S) : Jalowiecki et al.

Page 1 of 2

It is certified that error appears in the above-identified patent and that said Letters Patent is hereby corrected as shown below:

On the Title Page, in Column 1, below "Prior Publication Data", delete " 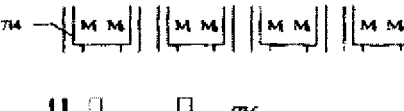 " and insert

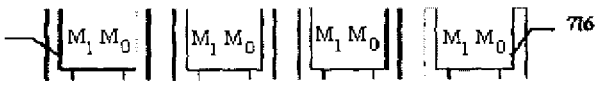

(51) Int. Cl.
-- *G06F 13/28* (2006.01) --, therefor.

In the Drawings

In Figure 6, Sheet 6 of 8, delete "!(READ_DATA" and insert -- !(READ_DATA) --. therefor.

In Figure 8, Sheet 7 of 8, delete "  " and insert

-- 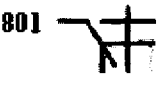 --, therefor.

In Figure 9, Sheet 8 of 8, delete " 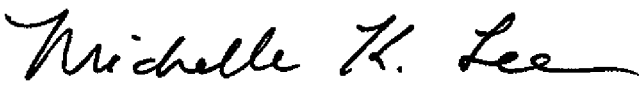 --, therefor.

Signed and Sealed this  
Twenty-eighth Day of January, 2014

Michelle K. Lee  
*Deputy Director of the United States Patent and Trademark Office*

CERTIFICATE OF CORRECTION (continued)
U.S. Pat. No. 7,096,318 B2

In the Specifications

In Column 3, Line 62, delete "blocks." and insert -- blocks, --, therefor.

In Column 4, Line 5, delete "bits" and insert -- bits, --, therefor.

In Column 4, Line 14, delete "memory" and insert -- memory. --, therefor.

In Column 5, Line 67, after "FIG. 2" delete "and".

In Column 7, Line 55, delete "NMOS" and insert -- nMOS --, therefor.

In Column 12, Line 40, delete "FIG. 8. A third" and insert -- FIG. 8, a third --, therefor.

In Column 13, Line 49, delete "then" and insert -- then: --, therefor.

In the Claims

In Column 17, Line 16, Claim 20, delete "altermating" and insert -- alternating --, therefor.

In Column 18, Line 16, Claim 25, delete "be read" and insert -- to be read --, therefor.